(12) United States Patent
Wierer, Jr. et al.

(10) Patent No.: US 7,442,965 B2
(45) Date of Patent: Oct. 28, 2008

(54) PHOTONIC CRYSTAL LIGHT EMITTING DEVICE

(75) Inventors: Jonathan J. Wierer, Jr., Fremont, CA (US); Michael R. Krames, Mountain View, CA (US); John E. Epler, Milpitas, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 11/373,636

(22) Filed: Mar. 9, 2006

(65) Prior Publication Data

US 2006/0163606 A1    Jul. 27, 2006

Related U.S. Application Data

(62) Division of application No. 10/804,810, filed on Mar. 19, 2004.

(51) Int. Cl.
*H01L 33/00* (2006.01)
(52) U.S. Cl. .................. 257/98; 257/101; 257/E33.005; 257/E33.006
(58) Field of Classification Search .................... 257/98
See application file for complete search history.

(56) References Cited

U.S. PATENT DOCUMENTS

| | | | |
|---|---|---|---|
| 5,371,025 A | 12/1994 | Sung | |
| 5,779,924 A | 7/1998 | Krames et al. | |
| 5,955,749 A | 9/1999 | Joannopoulos et al. | |
| 6,071,795 A | 6/2000 | Cheung et al. | |
| 6,156,581 A | 12/2000 | Vaudo et al. | |
| 6,307,218 B1 | 10/2001 | Steigerwald et al. | |
| 6,335,548 B1 | 1/2002 | Roberts et al. | |
| 6,363,096 B1 | 3/2002 | Dodabalapur et al. | |
| 6,559,075 B1 | 5/2003 | Kelly et al. | |

(Continued)

FOREIGN PATENT DOCUMENTS

EP    0 874 405 A2    10/1998

(Continued)

OTHER PUBLICATIONS

J.J. Wierer et al., "InGaN/GaN quantum-well heterostructure light-emitting diodes employing photonic crystal structures," Applied Physics Letters, vol. 84, No. 19, May 10, 2004, pp. 3885-3887.

(Continued)

*Primary Examiner*—Tu-Tu V Ho
(74) *Attorney, Agent, or Firm*—Patent Law Group LLP; Rachel V. Leiterman

(57) ABSTRACT

A photonic crystal structure is formed in an n-type region of a III-nitride semiconductor structure including an active region sandwiched between an n-type region and a p-type region. A reflector is formed on a surface of the p-type region opposite the active region. In some embodiments, the growth substrate on which the n-type region, active region, and p-type region are grown is removed, in order to facilitate forming the photonic crystal in an an-type region of the device, and to facilitate forming the reflector on a surface of the p-type region underlying the photonic crystal. The photonic crystal and reflector form a resonant cavity, which may allow control of light emitted by the active region.

24 Claims, 8 Drawing Sheets

U.S. PATENT DOCUMENTS

| | | | |
|---|---|---|---|
| 6,770,353 | B1 | 8/2004 | Mardilovich et al. |
| 6,831,302 | B2 | 12/2004 | Erchak et al. |
| 7,012,279 | B2 | 3/2006 | Wierer, Jr. et al. |
| 2002/0004307 | A1 | 1/2002 | Yamada |
| 2002/0126721 | A1* | 9/2002 | Kito et al. ............... 375/45 |
| 2002/0130311 | A1 | 9/2002 | Lieber et al. |
| 2002/0190260 | A1* | 12/2002 | Shen et al. ............... 257/81 |
| 2003/0016895 | A1 | 1/2003 | Holm et al. |
| 2003/0089899 | A1 | 5/2003 | Lieber et al. |
| 2003/0141507 | A1 | 7/2003 | Krames et al. |
| 2003/0222263 | A1 | 12/2003 | Choi |
| 2003/0235229 | A1 | 12/2003 | Deng et al. |
| 2004/0016936 | A1 | 1/2004 | Tanaka et al. |
| 2004/0109644 | A1 | 6/2004 | Assefa et al. |
| 2004/0207320 | A1 | 10/2004 | Erchak |
| 2004/0207323 | A1 | 10/2004 | Erchak et al. |
| 2004/0213307 | A1 | 10/2004 | Lieber et al. |
| 2005/0011431 | A1 | 1/2005 | Samuelson et al. |
| 2005/0040419 | A1 | 2/2005 | Erchak et al. |
| 2005/0040424 | A1 | 2/2005 | Erchak et al. |
| 2005/0051785 | A1 | 3/2005 | Erchak et al. |
| 2005/0051787 | A1 | 3/2005 | Erchak et al. |
| 2005/0087754 | A1 | 4/2005 | Erchak |
| 2005/0087757 | A1 | 4/2005 | Erchak et al. |
| 2005/0127375 | A1 | 6/2005 | Erchak et al. |
| 2005/0145877 | A1 | 7/2005 | Erchak |
| 2005/0151125 | A1 | 7/2005 | Erchak et al. |
| 2005/0167687 | A1 | 8/2005 | Erchak et al. |
| 2005/0173717 | A1* | 8/2005 | Lee et al. ............... 257/98 |
| 2005/0211994 | A1 | 9/2005 | Erchak et al. |
| 2006/0151794 | A1 | 7/2006 | Wierer, Jr. et al. |
| 2006/0284187 | A1 | 12/2006 | Wierer, Jr. et al. |

FOREIGN PATENT DOCUMENTS

| | | |
|---|---|---|
| EP | 1 071 143 A1 | 1/2001 |
| EP | 1 385 215 A2 | 1/2004 |
| JP | 07176788 | 7/1995 |
| WO | WO 03/023857 A2 | 3/2003 |
| WO | WO 2004/004927 A2 | 1/2004 |
| WO | WO 2004/032193 A2 | 4/2004 |
| WO | WO 2004/034025 A2 | 4/2004 |
| WO | WO 2004/038767 A2 | 5/2004 |

OTHER PUBLICATIONS

U.S. Appl. No. 10/804,810, filed Mar. 19, 2004 entitled "Photonic Crystal Light Emitting Device," 28 pages.

Lee et al., "Modified spontaneous emission from a two-dimensional photonic bandgap crystal slab," J. Opt. Soc. Am. B, vol. 17, No. 8, Aug. 2000, pp. 1438-1442.

Boroditsky et al., "Surface recombiantion measurements on III-V candidate materials for nanostructure light-emitting diodes," Journal of Applied Physics, vol. 87, No. 7, Apr. 1, 2000, pp. 3497-3504.

Boroditsky et al., "Light extraction from optically pumped light-emitting diode by thin-slab photonic crystals," Applied Physics Letters, vol. 75, No. 8, Aug. 23, 1999, pp. 1036-1038.

Windisch et al., "Light-emitting diodes with 31% external quantum efficiency by outcoupling of lateral waveguide modes," Applied Physics Letters, vol. 74, No. 16, Apr. 19, 1999, pp. 2256-2258.

Xu et al., "Finite-difference time-domain calculation of spontaneous emission lifetime in a microcavity," J. Opt. Soc. Am. B, vol. 16, No. 3, Mar. 1999, pp. 465-474.

Hwang et al., "Spontaneous emission rate of an electric dipole in a general microcavity," Physical Review B, vol. 60, No. 7, Aug. 15, 1999, pp. 4688-4695.

Fan et al., "High Extraction Efficiency of Spontaneous Emission from Slabs of Photonic Crystals," Physical Review Letters, vol. 78, No. 17, Apr. 28, 1997, pp. 3294-3297.

Vuckovic et al., "Surface Plasmon Enhanced Light Emitting Diode," Journal of Quantum Electronics, vol. 36, 2000, pp. 1-13.

M. Fujita et al., "Organic light-emitting diode with ITO/organic photonic crystal," Electronics Letters, Nov. 27, 2003, vol. 39, No. 24, 2 pages.

T.N. Oder et al., "III-nitride blue and ultraviolet photonic crystal light emitting diodes," Applied Physics Letter, vol. 84, No. 4, Jan. 26, 2004, pp. 466-468.

Hiroyuki Ichikawa et al., "Efficiency enhancement in a light-emitting diode with a two-dimensional surface grating photonic cyrstal," Applied Physics Letters, vol. 84, No. 4, Jan. 26, 2004, pp. 457-459.

J. Ristic et al., "Characterization of GaN quantum discs embedded in AlxGa1-xN nanocolumns grown by molecular beam epitaxy," Physical Review B68, (2003), The American Physical Society, pp. 125305-1 to 125305-5.

J.Noborisaka et al., "Catalyst-free growth of GaAs nanowires by selective-area metalorganic vapor-phase epitaxy," Applied Physics Letters 86, (2005), American Institute of Physics, pp. 213102-1 to 213103-3.

T. Hamano et al. "New Technique for Fabrication of Two-Dimensional Photonic Bandgap Crystals by Selective Epitaxy," Jpn. J. Appl. Phys. vol. 36 (1997), pp. L286 to L288.

S. Haffouz et al., "Effect of Magnesium and Silicon on the lateral overgrowth of GaN patterned substrates by Metal Organic Vapor Phase Epitaxy," MRS Internet J. Nitride Semicond. Res. 3, 8 (1998), 1998-1999 The Materials Reseach Society, pp. 1 to 6.

G. Kipshidze et al., "Controlled growth of GaN nanowires by pulsed metalorganic chemical vapor deposition," Applied Physics Letters 86, (2005) American Institute of Physics, pp. 033104-1 to 033104-3.

Kwa-Mok Kim et al., "Growth and characterization of single-crystal GaN nanorods by hydride vapor phase epitaxy," Applied Physics Letters, vol. 81, No. 12, Sep. 16, 2002, pp. 2193 ton 2195.

S. Han et al, "Controlled growth of gallium nitride single-crystal nanowires using a chemical vapor deposition method," J. Mater. Res., vol. 18, No. 2, Feb. 2003, Materials Research Society, pp. 245 to 249.

Hwa-Mok Kim, et al., "Nanoscale Ultraviolet-Light-Emitting Diodes Using Wide-Bandgap Gallium Nitride Nanorods," Adv. Mater.2003, 15, No. 7-8, Apr. 17, Wiley-VCH Verlag GmbH & Co. KGaA, Weinheim, pp. 567-569.

T. Kuykendall et al., "Metalorganic Chemical Vapor Deposition Route to GaN Nanowires with Triangular Cross Sections," Nano Letters, 2003, vol. 3, No. 8, American Chemical Society, pp. 1063 to 1066.

Hwa-Mok Kim, et al., "High-Brightness Light Emitting Diodes Using Dislocation-Free Indium Gallium Nitride/Gallium Nitride Multiquantum-Well Nanorod Arrays," Nano Letters 2004, vol. 4, No. 6, American Chemical Society, pp. 1059 to 1062.

V.V. Mamutin, et al., "Growth of Self-Organized GaN Nanostructures on Al2O3 (0001) by RF MBE," Proc. Int. Workshop on Nitride Semiconductors, IPAP Conf. Series 1 pp. 413 to 416, unknown date.

J. Su et al., "Catalytic growth of group III-nitride nanowires and nanostructures by metalorganic chemical vapor deposition," Applied Physics Letters 86, (2005), American Institute of Physics, pp. 013105-1 to 013105-3.

W. D. Zhou et al, "Electrically injected single-defect photonic bandgap surface-emitting laser at room temperature," Electronic Letters, Aug. 31, 2000, vol. 36, No. 18, pp. 1541 to 1542.

P. Bhattacharya et al., "Electrically Injected Photonic Bandgap Microcavity Light Sources," LEOS 2001 14th. Annual Meeting of the IEEE Lasers & Electro-Optics Society, San Diego, Ca, Nov. 11-15, vol. 1 of 2, pp. 76 to 77.

S. Kitamura et al, "Fabrication of GaN Hexagonal Pyramids on Dot-Patterned GaN/Sapphire Substrates via Selective Metalorganic Vapor Phase Epitaxy," Jpn. J. Appl. Phys., vol. 34 (1995), Part 2, No. 9B, Sep. 15, 1995, pp. L1184 to L1186.

M. Nagahara et al., "Selective Growth of Cubic GaN in Small Areas on Patterned GaAs (100) Substrates by Metalorganic Vapor Phase Epitaxy," Jpn. J. Appl. Phys., vol. 33 (1994), Part 1, No. 1B, Jan. 1994, pp. 694 to 697.

A. Kikuchi et al., "Self-Organized InGaN/GaN Multiple Quantum Well Nanocolumn Light Emitting Diodes Grown On (111) Si Substrate," Department of Electrical and Electronics Engineering, Sophia University, 1 page, unknown date.

P.A. Kohl, "Photoelectrochemical etching of semiconductors", IBM J. Res. Develop., vol. 42, No. 5, Sep. 5, 1998, pp. 629-637.

Chen-Fu Chu et al., "Comparison of p-Side Down and p-Side Up GaN Light-Emitting Diodes Fabricated by Laser Lift-Off", Jpn. J. Appl. Phys., vol. 42 (2003), Part 2, No. 2B, Feb. 15, 2003, pp. L147-L150.

W.S. Wong et al., "InxGa1-xN emitting diodes on Si substrates fabricated by Pd-In metal bonding and laser lift-off", Applied Physics Letters, vol. 77, No. 18, Oct. 30, 2000, pp. 2822-2824.

H. Benisty et al., "Impact of Planar Microcavity Effects on Light Extraction—Part 1: Basic Concepts and Analytical Trends", IEEE Journal of Quantum Electronics, vol. 34, No. 9, Sep. 1998, pp. 1612-1631.

T. Fujii et al., "Increase in the extraction efficiency of GaN-based light-emitting diodes via surface roughening", Applied Physics Letters, vol. 84, No. 6, Feb. 9, 2004, pp. 855-857.

Y.-K. Song et al., "Resonant-cavity InGaN quantum-well blue light-emitting diodes", Applied Physics Letters, vol. 77, No. 12, Sep. 18, 2000, pp. 1744-1746.

Michael R. Krames et al., U.S. Appl. No. 10/059,588, filed Jan. 28, 2002, entitled: "LED Efficiency Using Photonic Crystal Structure". 62 pages.

Jonathan J. Wierer Jr., U.S. Appl. No. 10/691,026, filed Oct. 21, 2003, entitled: "Photonic Crystal Light Emitting Device", 30 pages.

Tredicucci et al., "Single-mode surface-plasmon laser," Applied Physics Letters, vol. 76, No. 16, Apr. 17, 2000, pp. 2164-2166.

Imada et al., "Coherent two-dimensional lasing action in surface-emitting laser with triangular-lattice photonic cyrstal structure," Applied Physics Letters, vol. 75, No. 3, Jul. 19, 1999, pp. 316-318.

Pottage et al., "Vertical-cavity surface-emitting resonances in photonic crystal films," J. Opt. Soc. Am. A, vol. 18, No. 2, Feb. 2001, pp. 442-447.

Tiwari, S., "Compound Semiconductor Device Physics," Academic Press, Inc., San Diego, CA, 1992, pp. 182-186.

G.B. Stringfellow and M. George Crawford, eds., "High Brightness Light Emitting Diodes," Academic Press, Inc., 1997, Chapter5, "AlGaInP Light-Emitting Diodes," by F.A. Kish and R.M. Fletcher, pp. 149-170.

European Search Report, 3 pages, May 30, 2005.

* cited by examiner

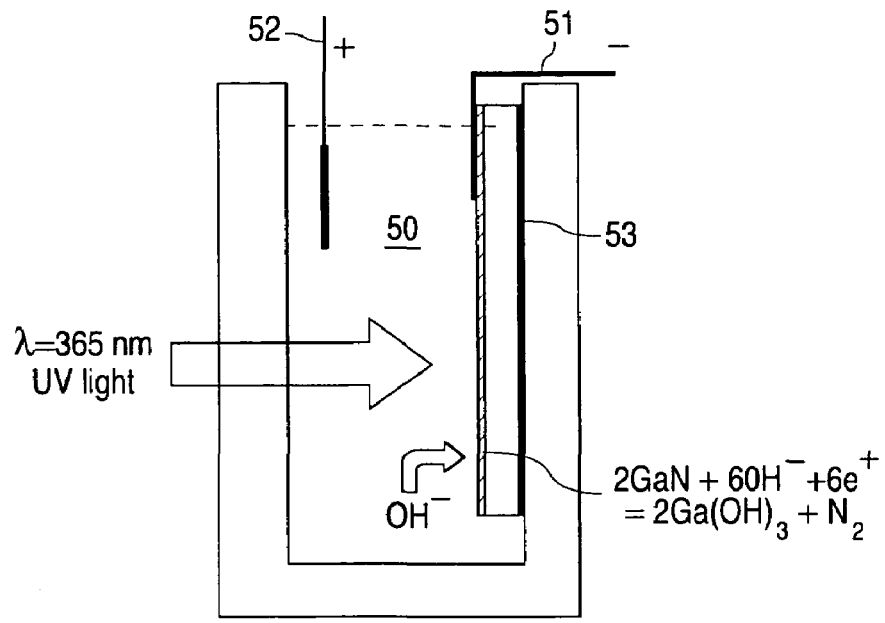
FIG. 8
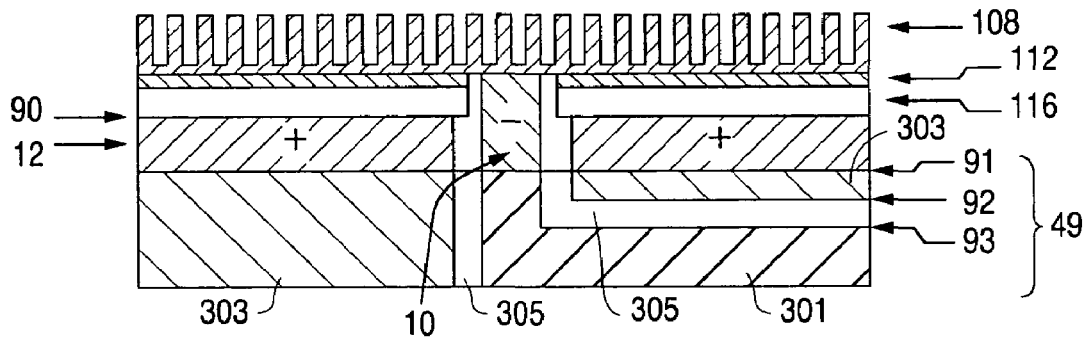
FIG. 13
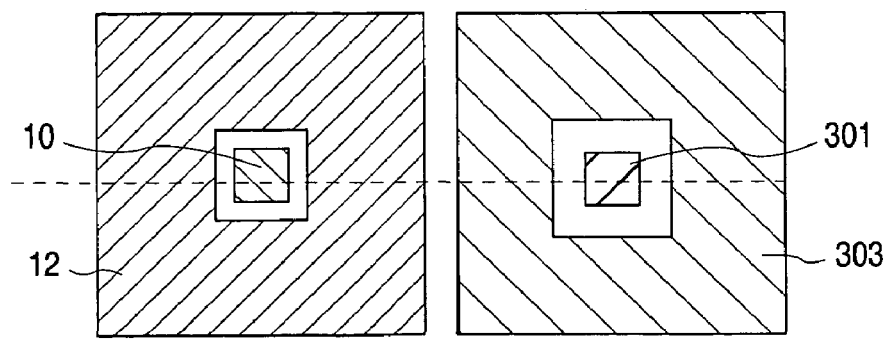
FIG. 14A  FIG. 14B

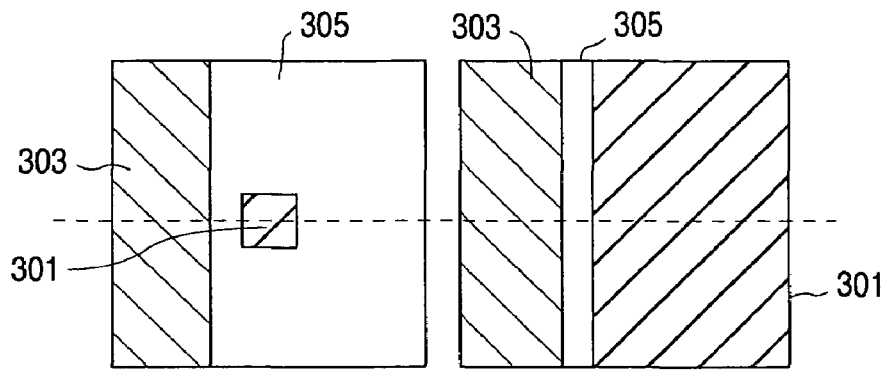
FIG. 14C   FIG. 14D
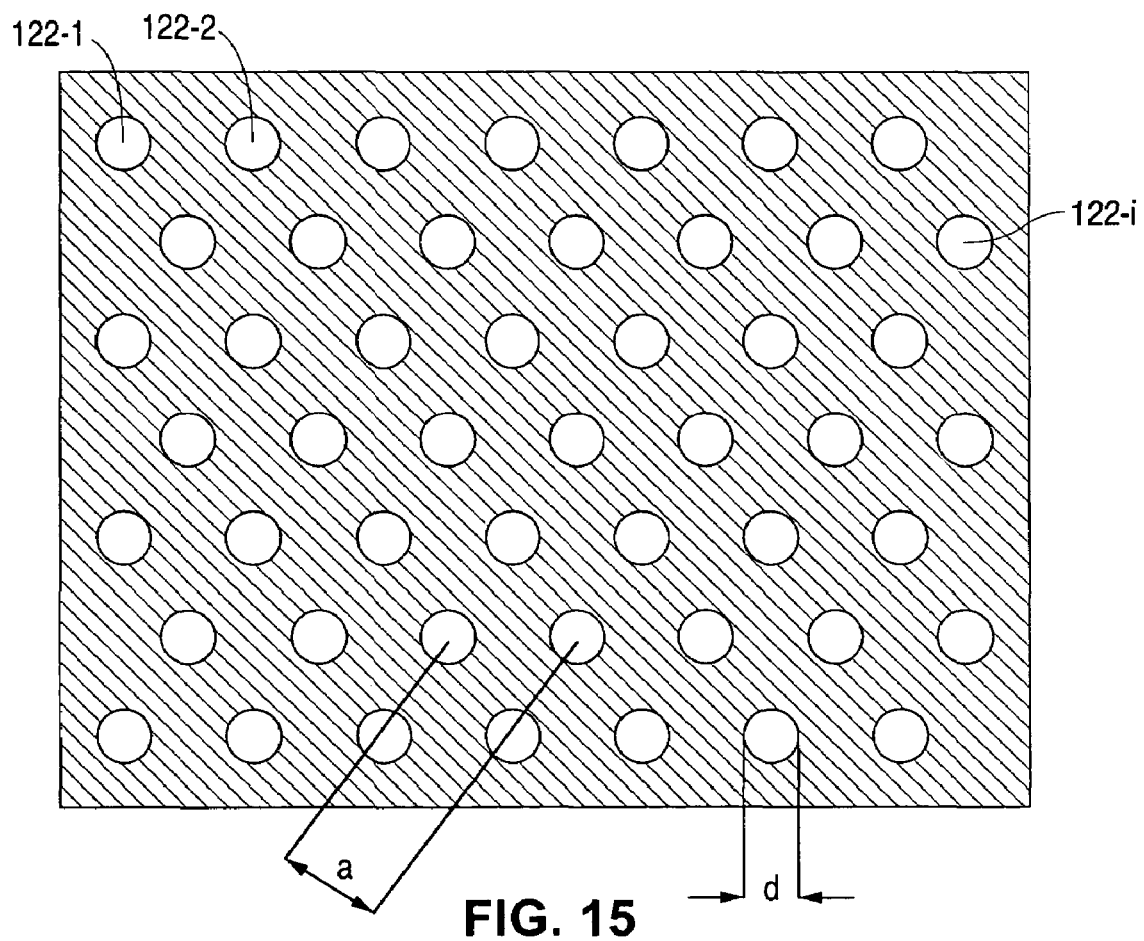
FIG. 15

US 7,442,965 B2

PHOTONIC CRYSTAL LIGHT EMITTING DEVICE

CROSS REFERENCE TO RELATED APPLICATIONS

This application is a division of application Ser. No. 10/804,810, filed Mar. 19, 2004 and incorporated herein by reference.

BACKGROUND

1. Field of Invention

The present invention relates to semiconductor light emitting devices including photonic crystal structures.

2. Description of Related Art

Light emitting diodes ("LEDs") are technologically and economically advantageous solid state light sources. LEDs are capable of reliably providing light with high brightness, hence in the past decades they have come to play a critical role in numerous applications, including flat-panel displays, traffic lights, and optical communications. An LED includes a forward biased p-n junction. When driven by a current, electrons and holes are injected into the junction region, where they recombine and release their energy by emitting photons. The quality of an LED can be characterized, for example, by its extraction efficiency, which measures the intensity of the emitted light for a given number of photons generated within the LED chip. The extraction efficiency is limited, for example, by the emitted photons suffering multiple total internal reflections at the walls of the high refractive index semiconductor medium. As a result, the emitted photons do not escape into free space, leading to poor extraction efficiencies, typically less than 30%.

In the past thirty years, various approaches have been proposed to enhance the extraction efficiency of LEDs. The extraction efficiency can be increased, for example, by enlarging the spatial angle in which the emitted photons can escape by developing suitable geometries, including cubic, cylindrical, pyramidal, and dome like shapes. However, none of these geometries can entirely eliminate losses from total internal reflection.

A further source of loss is the reflection caused by the refractive index mismatch between the LED and the surrounding media. While such losses could be reduced with an anti-reflection coating, complete cancellation of reflection can be achieved only at a specific photon energy and one angle of incidence.

U.S. Pat. No. 5,955,749, entitled "Light Emitting Device Utilizing a Periodic Dielectric Structure," granted to J. Joannopoulos et al., describes an approach to the problem of enhancing the extraction efficiency. According to U.S. Pat. No. 5,955,749, a photonic crystal is created by forming a lattice of holes completely through the semiconductor layers of the light emitting diode. The lattice of holes creates a medium with a periodically modulated dielectric constant, affecting the way light propagates through the medium. The photons of the light emitting diode can be characterized by their spectrum or dispersion relation, describing the relation between the energy and the wavelength of the photons. The relationship may be plotted, yielding a photonic band diagram consisting of energy bands, or photonic bands, separated by band gaps. Though the photonic band diagram is analogous to the spectrum of electrons in crystalline lattices as expressed in an electronic band diagram, the photonic band diagram is unrelated to the electronic band diagram. When a photonic crystal is formed in an LED it affects how light propagates in the structure. Therefore if the proper lattice spacing is chosen, light that would otherwise have been trapped in the structure by total internal reflection can now escape, increasing the extraction of the LED. Also, alternative lattices can reduce the photon mode volume in the LED structure increasing the radiative rate or internal efficiency of the LED active layer.

In an effort to explore the usefulness of photonic crystals for light generation, U.S. Pat. No. 5,955,749 gives a partial description of a theoretical structure of a photonic crystal device.

U.S. Pat. No. 5,955,749 describes an n-doped layer, an active layer, a p-doped layer, and a lattice of holes formed in these layers. However, the device of U.S. Pat. No. 5,955,749 is not operational and therefore is not a LED. First, electrodes are not described, even though electrodes are needed for the successful operation of a photonic crystal LED ("PXLED"). Though the fabrication of electrodes in regular LEDs is known in the art, for PXLEDs neither the fabrication of electrodes, nor their influence on the operation of the PXLED is obvious. For example, suitably aligning the mask of the electrode layer with the lattice of holes may require new fabrication techniques. Also, electrodes are typically thought to reduce the extraction efficiency as they reflect a portion of the emitted photons back into the LED, and absorb another portion of the emitted light.

Second, U.S. Pat. No. 5,955,749 proposes fabricating photonic crystal light emitting devices from GaAs. GaAs is indeed a convenient and hence popular material for fabricating regular LEDs. However, it has a high surface recombination velocity of about $10^6$ cm/sec as described, for example, by S. Tiwari in "Compound Semiconductor Devices Physics," Academic Press (1992). The surface recombination velocity expresses the rate of the recombination of electrons and holes on the surface of the diode. Electrons and holes are present in the junction region of the LED, originating from the n-doped layer and the p-doped layer, respectively. When electrons and holes recombine across the electronic band gap, the recombination energy is emitted in the form of photons and generates light. However, when electrons and holes recombine through intermediate electronic states in the electronic band gap, then the recombination energy is emitted in the form of heat instead of photons, reducing the light emission efficiency of the LED. In an ideal crystal there are no states in the electronic band gap. Also, in today's high purity semiconductor crystals there are very few states in the electronic band gap in the bulk material. However, on the surface of semiconductors typically there are a large number of surface states and defect states, many of them in the electronic band gap. Therefore, a large fraction of electrons and holes that are close to the surface will recombine through these surface and defect states. This surface recombination generates heat instead of light, considerably reducing the efficiency of the LED.

This problem does not result in a serious loss of efficiency for regular LED structures. However, PXLEDs include a large number of holes, thus PXLEDs have a much larger surface area than regular LEDs. Therefore, the surface recombination may be capable of reducing the efficiency of the PXLED below the efficiency of the same LED without the photonic crystal structure, making the formation of photonic crystal structure pointless. Since GaAs has a high surface recombination velocity, it is not a promising candidate for fabricating photonic crystal LEDs. The seriousness of the problem is reflected by the fact that so far, to Applicants' knowledge, no electrically operated LED with the photonic crystal through the active region has been reported in the literature that uses GaAs and claims an enhanced extraction, or internal, efficiency. In particular, U.S. Pat. No. 5,955,749 does not describe the successful operation of a photonic crystal LED. Also, U.S. Pat. No. 5,955,749 does not describe the influence of the photonic crystal on the emission process, which can affect the internal efficiency of the LED.

While photonic crystals are promising for light extraction for the reasons described above, there are problems with the design. There are several publications describing experiments on a lattice of holes having been formed in a slab of a semiconductor. An enhancement of the extraction rate at photon energies in the photonic band gap has been reported by R. K. Lee et al. in "Modified Spontaneous Emission From a Two-dimensional Photonic Bandgap Crystal Slab," in the Journal of the Optical Society of America B, vol. 17, page 1438 (2000). Lee et al. not only shows the extraction benefits of a photonic crystal in a light emitting design, but also shows that the photonic lattice can influence the spontaneous emission. However, Lee et al. do not show how to form and operate a light emitting device with this design. A photonic crystal LED can be formed from Lee et al.'s light emitting design by including electrodes. The addition of the electrodes, however, will substantially affect the extraction and the spontaneous emission of the LED. Since this effect is unknown, it cannot be disregarded in the design of a LED. Since the Lee et al. design does not include such electrodes, the overall characteristics of an LED formed from that design are unclear. This questions the usefulness of the design of Lee et al.

SUMMARY

In accordance with embodiments of the device, a photonic crystal structure is formed in an n-type region of a III-nitride semiconductor structure including an active region sandwiched between an n-type region and a p-type region. A reflector is formed on a surface of the p-type region opposite the active region. In some embodiments, the growth substrate on which the n-type region, active region, and p-type region are grown is removed, in order to facilitate forming the photonic crystal in an n-type region of the device, and to facilitate forming the reflector on a surface of the p-type region underlying the photonic crystal. The photonic crystal and reflector form a resonant cavity, which may allow control of light emitted by the active region.

BRIEF DESCRIPTION OF THE DRAWINGS

FIG. 8 illustrates photoelectrochemical etching to thin the epitaxial layers after growth substrate removal.

FIG. 13 illustrates an alternative embodiment of the present invention.

FIGS. 14A-14D are cut away plan views of the device of FIG. 13.

FIG. 15 is a plan view of a photonic crystal structure comprising a planar lattice of holes.

DETAILED DESCRIPTION

Figure 1:
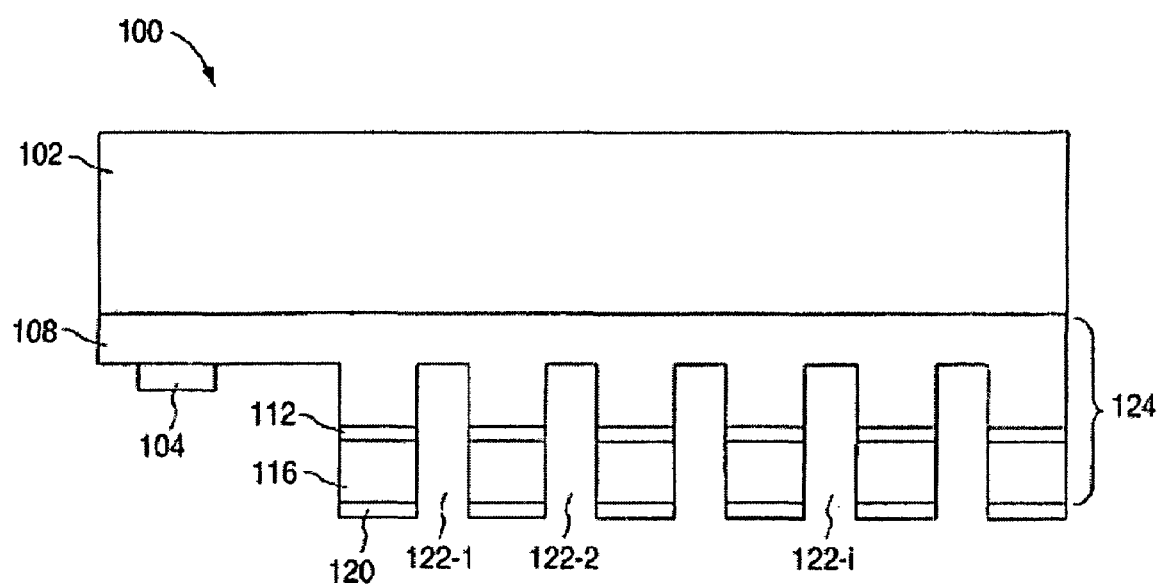
FIG. 1 is a cross sectional view of a photonic crystal light emitting diode.

FIG. 1 illustrates a III-nitride photonic crystal LED (PXLED) 100, described in more detail in application Ser. No. 10/059,588, "LED Efficiency Using Photonic Crystal Structure," filed Jan. 28, 2002 and incorporated herein by reference.

In PXLED 100 of FIG. 1, an n-type region 108 is formed over host substrate 102 which may be, for example, sapphire, SiC, or GaN; an active region 112 is formed over n-type region 108; and a p-type region 116 is formed over active region 112. Each of regions 108, 112, and 116 may be a single layer or multiple layers of the same or different composition, thickness, or dopant concentration. A portion of p-type region 116 and active region 112 are etched away to expose a portion of n-type region 108, then a p-contact 120 is formed on p-type region 116 and an n-contact 104 is formed on the exposed portion of n-type region 108.

Active region 112 includes a junction region where electrons from n-type region 108 combine with holes of p-type region 116 and ideally emit energy in the form of photons. Active layer 112 may include a quantum well structure to optimize the generation of photons. Many different quantum well structures have been described, for example, by G. B. Stringfellow and M. George Craford in "High Brightness Light Emitting Diodes," published by the Associated Press in 1997. The photonic crystal of PXLED 100 of FIG. 1 is created by forming a periodic structure of holes 122-i in the LED.

In the device illustrated in FIG. 1, a usual III-nitride structure is fabricated with the n-type region formed first on the substrate, followed by the active region and the p-type region. The photonic crystal device illustrated in FIG. 1 and the devices described in U.S. Pat. No. 5,955,749 may have several disadvantages. First, the photonic crystal structure in the device of FIG. 1 may be formed by, for example, dry etching into the p-type region to form a periodic structure. Dry etching could be reactive ion, inductively coupled plasma, focused ion beam, sputter etching, electron cyclotron resonance, or chemically assisted ion beam etching. Dry etching of p-type material is problematic because etching can damage the crystal, causing vacancies which create n-type donors. In p-type region 116, the presence of n-type donors lowers the concentration of holes and, in cases of severe damage to the crystal, can change the conductivity type of region 116 to n-type. The inventors have discovered that the damage caused by dry etching is not limited to a localized area around the etched region, and may propagate vertically and laterally through the non-etched areas of the crystal, possibly eliminating the p-n junction and rendering the device electrically non-operational. The devices described in U.S. Pat. No. 5,955,749 also etch through p-type material, and therefore may suffer from the same widespread damage observed by the inventors. Second, in both the device of FIG. 1 and the devices in U.S. Pat. No. 5,955,749, portions of the active region are removed to form the photonic crystal structure, reducing the amount of active region material and potentially reducing the amount of light generated in the device. Also, etching through the quantum wells creates surface recombination, potentially lowering the efficiency of the device.

Figure 2:
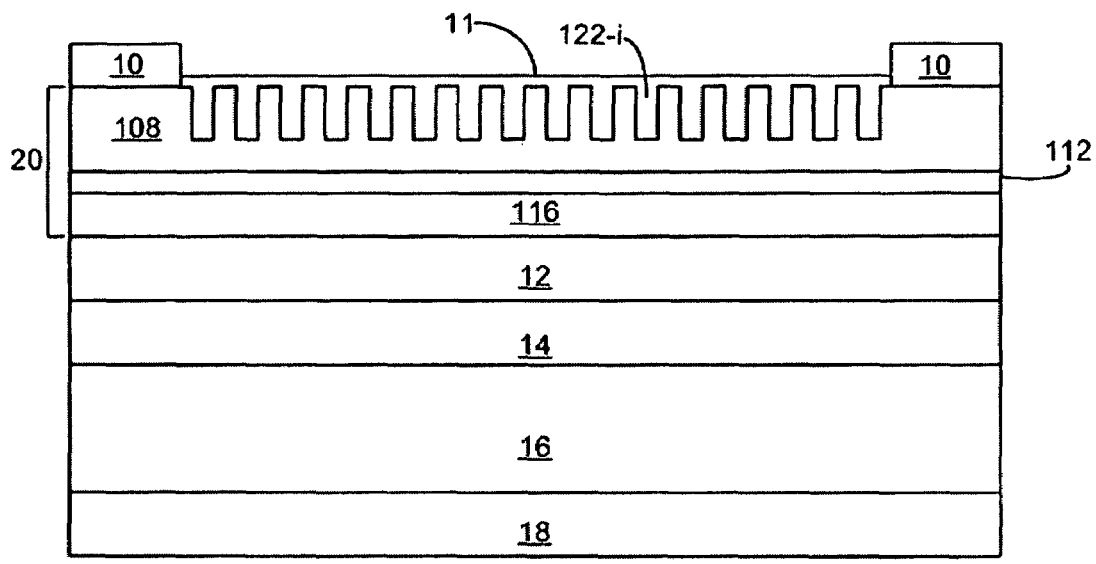
FIG. 2 is a cross sectional view of an embodiment of a photonic crystal light emitting device lacking a growth substrate.
Figure 3:
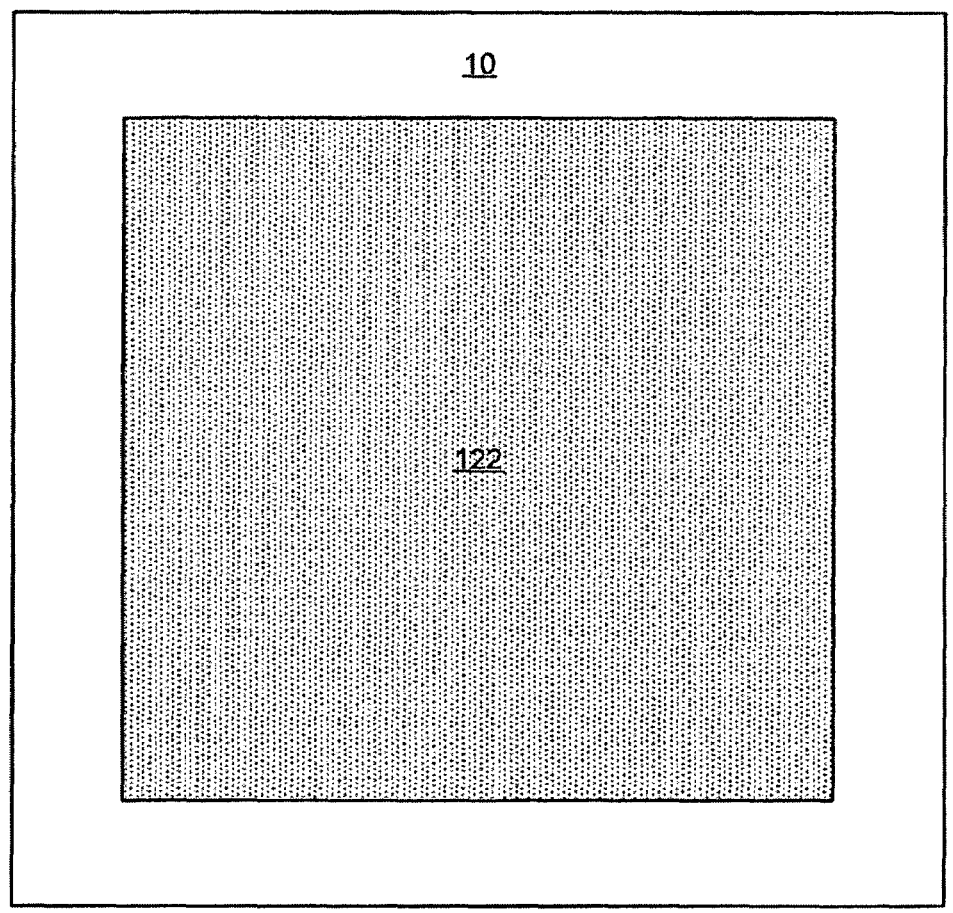
FIG. 3 is a plan view of the device of FIG. 2.

In accordance with embodiments of the invention, a photonic crystal is formed in an n-type layer of a III-nitride device attached to a host substrate and from which the growth substrate has been removed. Such devices may emit light between about 280 and about 650 nm and usually emit light between about 420 and about 550 nm. FIG. 2 is a cross sectional view of an embodiment of the invention. FIG. 3 is a plan view of the device of FIG. 2. As illustrated in FIG. 2, the photonic crystal 122 is formed in n-type region 108, rather than p-type region 116. N-contact 10 is formed on a region of n-type region 108 that is not textured with the photonic crystal, though in other embodiments n-contact 10 may be formed on the photonic crystal area of n-type region 108. Since the photonic crystal is formed in an n-type region, the n-type material is able to laterally inject current from contact 10 to photonic crystal 122. Light is extracted from the device through photonic crystal 122, thus the arrangement of n-contact 10 is selected to maximize the area of the photonic crystal. For example, as illustrated in FIG. 3, n-contact 10 may surround photonic crystal region 122-i. N-contact 10 is not limited to a ring contact but could also be a grid or other structure that facilitates proper current spreading. To avoid light being absorbed by the n-contact 10, implantation or a dielectric can be used on the epitaxial material under n-contact 10, preventing current flow and light generation in that area. A reflective p-contact 12 is formed on p-type region 116. In contrast to the device illustrated in FIG. 1, the device of FIG. 2 has the p- and n-contacts formed on opposite sides of the device. P-contact 12 connects the epitaxial layers 20 to a host substrate 16 either directly or via optional bonding layers 14. An optional contact 18 may be formed on the surface of host substrate 16 opposite the device layers 20.

FIGS. 13 and 14A-14D illustrate an alternative embodiment of the present invention. FIGS. 14A, 14B, 14C, and 14D are cut away plan views along axes 90, 91, 92, and 93, respectively, illustrated in the cross sectional view of FIG. 13. In the device of FIG. 13, both p and n-contacts 12 and 10 are on the host substrate side of the device, eliminating absorption of light by a top side n-contact, as in the device of FIGS. 2 and 3. One or more vias are etched down to n-type region 108 through p-type region 116 and active region 112 to make n-contact 10. Host substrate structure 49 is fabricated in a layered structure to electrically isolate the p- and n-contacts. An example of the layer structure is illustrated by FIGS. 14A-14D, which show plan view slices of the host substrate along axes 90, 91, 92, and 93 of FIG. 13. N-metal 301 and p-metal 303 are routed such that at the bottom of the host substrate the positive and negative contacts are separate and can be easily soldered to another structure. N-metal 301 and p-metal 303 may be electrically isolated by dielectric 305. Depending on the area of the LED one or more n-contact vias may be necessary to provide sufficient current spreading. Bonding the patterned LED to the patterned host can be accomplished using a flip-chip bonder.

Bonding the epitaxial layers of the device to a host substrate, then removing the growth substrate allows the photonic crystal structure of the device to be formed in an n-type region. Etching the photonic crystal structure in an n-type region rather than a p-type region avoids the type-conversion problem associated with p-type III-nitrides, described above. Also, vacancies introduced in the n-type region from etching do not affect the conductivity of the material. In addition, since the photonic structure in n-type region 108 is separated from p-type region 116 and active region 112, damage to these regions caused by etching the photonic structure is avoided. The exposed top n-type layer allows for formation of the photonic crystal proximal to the active region. In alternative embodiments where surface recombination is low the photonic crystal may penetrate the active region and p-type region.

Alternatively, rather than bonding the epitaxial layers to a host, then removing the growth substrate, a device with an exposed top n-type region may be formed by growing the p-type region first on a growth substrate, followed by an active region and n-type region. Ignoring the growth difficulties, this would present n-type layer on the surface just as in FIG. 2, such that etching damage is not a concern. Contacts to the p-GaN layers would have to be formed on the surface by first exposing the p-type layers by etching a mesa. Therefore current would have to spread laterally along resistive p-type layers, creating a device with high operating voltage, a result that is undesirable in many applications. Alternatively the substrate could be removed from this structure so that the operating voltage is not high. This is done by first bonding a host to the top n-type layers and then removing the growth substrate. Next etching is performed to remove the initial growth layers and expose the p-type region. Then a second bonding step with a second host is performed on the now-exposed p-type layers. The first host is removed re-exposing the n-type region for photonic crystal formation. The resulting structure is the same as FIG. 2.

The photonic crystal structure can include a periodic variation of the thickness of n-type region 108, with alternating maxima and minima. An example is a grating (one-dimensional lattice) or planar lattice of holes 122 (two-dimensional lattice). The lattice is characterized by the diameter of the holes, d, the lattice constant a, which measures the distance between the centers of nearest neighbor holes, the depth of the holes w, and the dielectric constant of the dielectric, disposed in the holes, $\epsilon_h$. Parameters a, d, w, and $\epsilon_h$ influence the density of states of the bands, and in particular, the density of states at the band edges of the photonic crystal's spectrum. Parameters a, d, w, and $\epsilon_h$ thus influence the radiation pattern emitted by the device, and can be selected to enhance the extraction efficiency from the device. Alternatively, when the proper photonic crystal parameters are chosen, the radiation pattern of the emitted light can be narrowed, increasing the radiance of the LED. This is useful in applications where light at only specific angles is useful. In one embodiment, the photonic crystal parameters are chosen such that greater than 50% of radiation exiting the device is emitted in an exit cone defined by an angle of 45 degrees to an axis normal to a surface of the device.

Holes 122-i can be arranged to form triangular, square, hexagonal, honeycomb, or other well-known two-dimensional lattice types. In some embodiments, different lattice types are formed in different regions of the device. Holes 122-i can have circular, square, hexagonal, or other cross sections. In some embodiments, the lattice spacing a is between about 0.1 λ and about 10 λ, preferably between about 0.1 λ and about 4 λ, where λ is the wavelength in the device of light emitted by the active region. In some embodiments, holes 122 may have a diameter d between about 0.1 a and about 0.5 a, where a is the lattice constant. Holes 122-i can be filled with air or with an optional dielectric 11 (FIG. 2) of dielectric constant $\epsilon_h$, often between about 1 and about 16. Possible dielectrics include silicon oxides.

Photonic crystal 122 and the reflection of the photonic crystal from reflective p-contact 12 form a GaN resonant cavity. The resonant cavity offers superior control of the light. As the GaN cavity is thinned the optical mode volume is reduced. Fewer waveguided modes can be trapped in the cavity increasing the chances for the light to exit the device. This can be explained in the following discussion. The photonic crystal can affect the waveguided modes by scattering them out of the crystal. As the number of waveguided modes is reduced the more efficient the light extraction of the LED. For example if the epitaxial layers are thin enough to support only one waveguided mode (m), then initially 50% of the light would exit the GaN ($L_{out}$) and 50% would be waveguided in the epitaxial layers ($L_{in}$). For this argument we assume that we form a photonic crystal that is able to extract an additional 40% of this waveguided light ($S_{eff}$). The extraction efficiency ($C_{ext}$) can be written as:

$$C_{ext}=L_{out}+m*(L_{in}\times S_{eff})$$

Therefore the extraction efficiency of this structure is 50%+1*(50%*40%)=70%. Compare this to an epitaxial structure that supports 4 waveguided modes with a photonic crystal again with $S_{eff}$=40%. If the light goes equally into all modes then each mode including the one exit mode has 20% of the light. This structure would only have an extraction efficiency of 20%+4*(20%*40%)=52%. In this argument the photonic crystal is not 100% efficient scattering out the light. In some embodiments the photonic crystal is etched deep enough and has the proper lattice dimensions so that a photonic band gap is created in the plane of the LED inhibiting waveguide modes, ($S_{eff}$=100%). The thinner the epitaxial layers the easier it is to create a photonic band-gap. The thickness of the cavity (i.e. the thickness of epitaxial layers 20) is selected such that the epitaxial layers are as thin as possible to reduce the number of waveguided modes, but thick enough to efficiently spread current. In many embodiments, the thickness of epitaxial layers 20 is less than about 1 μm, and preferably less than about 0.5 μm.

In some embodiments, the thickness of epitaxial layers 20 is between about λ and about 5λ, between about 0.18 μm and about 0.94 μm for a device that emits 450 nm light. Holes 122 have a depth between about 0.05 λ and the entire thickness of n-type region 108. Generally, holes 122 are formed entirely within n-type region 08 and do not penetrate into the active region. N-type region 108 usually has a thickness of about 0.1 microns or more. The depth of holes 122 is selected to place the bottoms of holes 122 as close to the active region as possible without penetrating the active region. In alternative embodiments the photonic crystal penetrates the active layers and p-type layers.

The radiation pattern emitted from the device can be tuned by changing the lattice type, distance between the active region and the photonic crystal, lattice parameter a, diameter d, depth w, and epitaxial thickness (20). The lattice parameter a and diameter d are illustrated in FIG. 15. In some embodiments, the radiation pattern may be adjusted to emit light preferentially in a chosen direction.

In some embodiments the periodic structure is a variation of the thickness of one or more selected semiconductor layers. The periodic structure can include variations of the thickness along one direction within the plane of the semiconductor layers, but extending along a second direction without variation, in essence forming a set of parallel grooves. Two-dimensional periodic variations of the thickness include various lattices of indentations.

Figure 4:
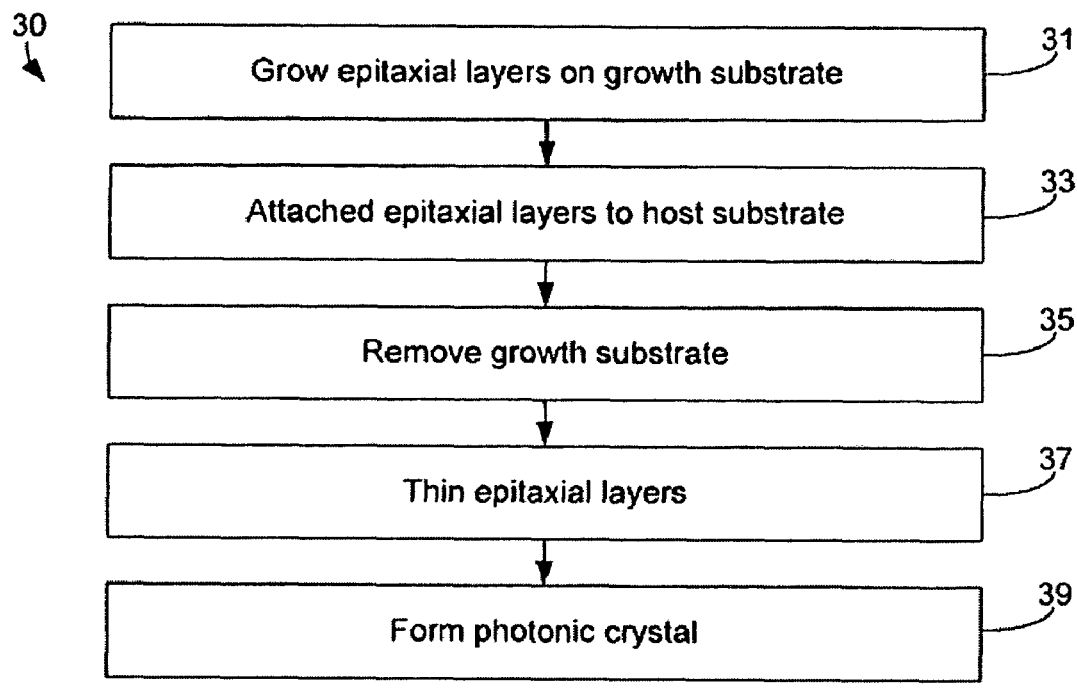
FIG. 4 illustrates a method of fabricating the device of FIG. 2.

The device illustrated in FIGS. 2 and 3 may be fabricated by the method illustrated in FIG. 4. In stage 31, epitaxial layers 20 of FIG. 2 are grown on a conventional growth substrate. The epitaxial layers are then attached to a host substrate in stage 33, such that the growth substrate can be removed in stage 35. The epitaxial layers may be thinned in optional stage 37, then a photonic crystal structure is formed on the exposed surface of the epitaxial layers in stage 39.

Figure 5:
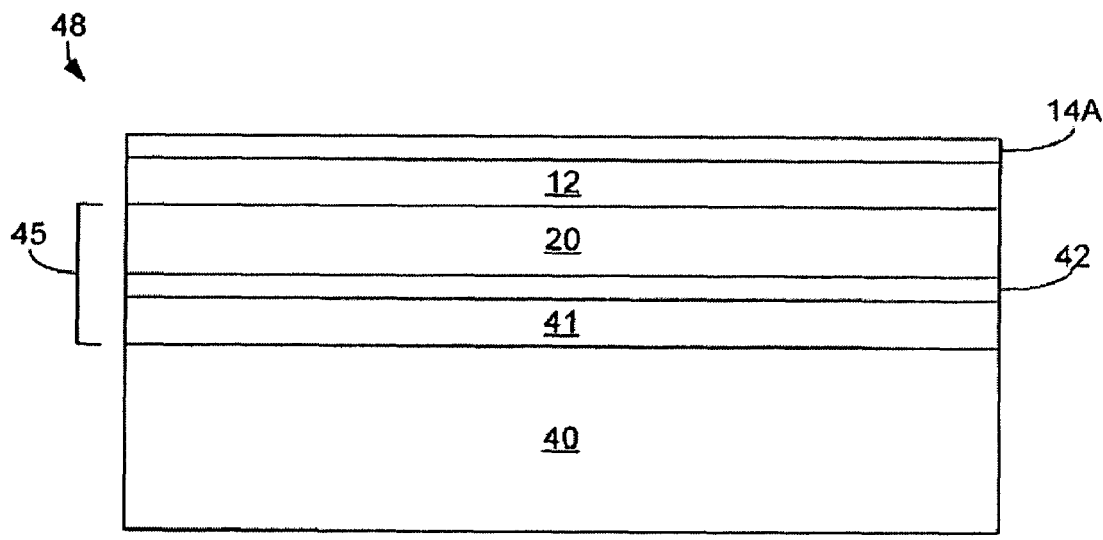
FIG. 5 illustrates an epitaxial structure prior to bonding to a host substrate.

FIG. 5 illustrates stage 31 of FIG. 4 in more detail. Epitaxial layers 20 of the device of FIG. 2 are grown on a substrate 40 such as sapphire, SiC, or GaN. Optional preparation layers 41, which may include, for example, buffer layers or nucleation layers, may be grown first on substrate 40 to provide a suitable growth substrate. One or more optional etch stop layers 42 may then be grown. Etch stop layers 42 may facilitate release of the growth substrate or facilitate thinning of the epitaxial layers, as described below. The epitaxial layers 20 are grown over etch stop layers 42 and include n-type region 108, active region 112, and p-type region 116. Usually, the n-type region is grown first, followed by the active region and the p-type region. A p-contact 12, often reflective, is formed on the surface of p-type region 116. P-contact 12 may be a single layer or may include multiple layers such as an ohmic contact layer, a reflective layer, and a guard metal layer. The reflective layer is usually silver or aluminum. The guard metal may include, for example, nickel, titanium, or tungsten. The guard metal may be chosen to prevent the reflective metal layer from migrating, particularly in the case of a silver reflective layer, and to provide an adhesion layer for a bonding layer 14A, used to bond the epitaxial structure to a host substrate.

Figure 6:
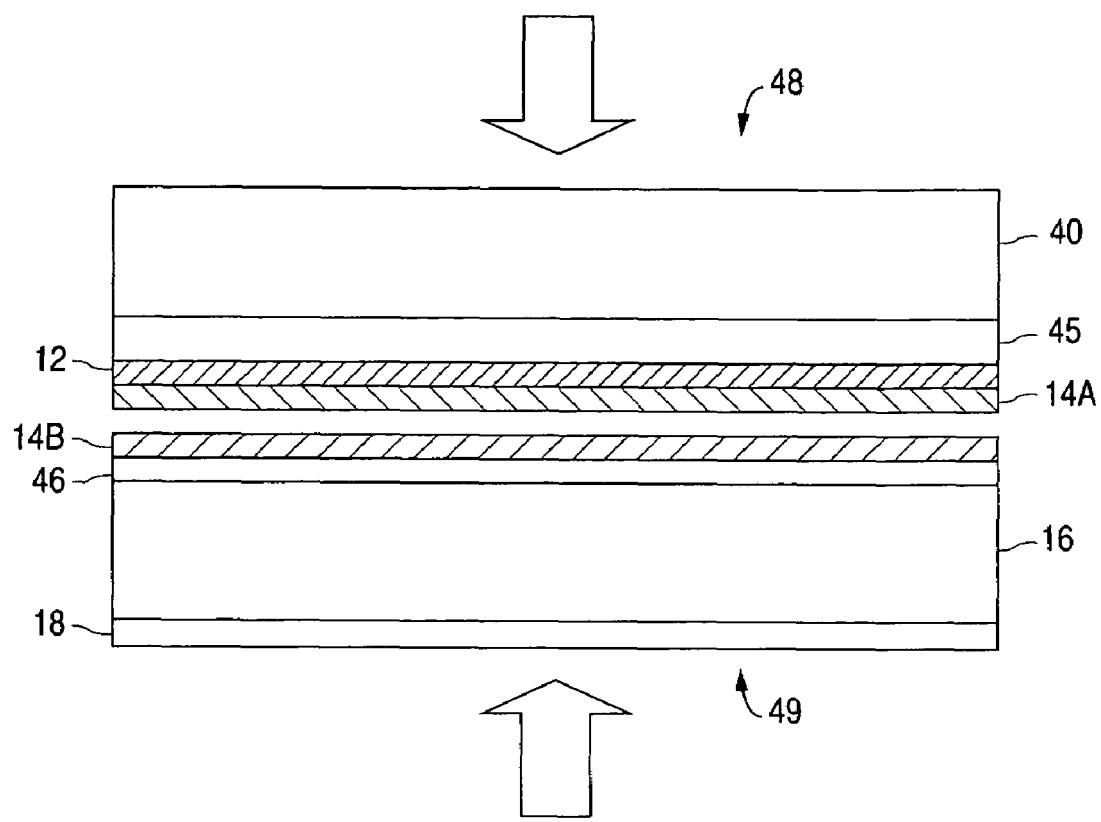
FIG. 6 illustrates a method of bonding an epitaxial structure to a host substrate.

FIG. 6 illustrates stage 33 of FIG. 4, attaching the epitaxial layers to a host substrate, in more detail. Bonding layers 14A and 14B, typically metal, serve as compliant materials for thermo-compression or eutectic bonding between the epitaxial structure and the host substrate. Examples of suitable bonding layer metals include gold and silver. Host substrate 16 provides mechanical support to the epitaxial layers after the growth substrate is removed, and provides electrical contact to p-contact 12. Host substrate 16 is selected to be electrically conductive (i.e. less than about 0.1 Ωcm), to be thermally conductive, to have a coefficient of thermal expansion (CTE) matched to that of the epitaxial layers, and to be flat (i.e. with an root mean square roughness less than about 10 nm) enough to form a strong wafer bond. Suitable materials include, for example, metals such as Cu, Mo, Cu/Mo, and Cu/W; semiconductors with metal contacts (layers 46 and 18 of FIG. 6), such as Si with ohmic contacts and GaAs with ohmic contacts including, for example, one or more of Pd, Ge, Ti, Au, Ni, Ag; and ceramics such as compressed diamond. The table below lists the properties of some suitable host substrates, as well as the properties of GaN and $Al_2O_3$ for comparison:

| Material | CTE ($10^{-6}$/K) | Thermal conductivity (W/m K) | Electrical resistance (Ωcm) |
| --- | --- | --- | --- |
| GaN | 2.4 | 130 | 0.01 |
| $Al_2O_3$ | 6.8 | 40 | Very high |
| Si | 2.7 | 150 | 0.01 plus contact resistance |
| GaAs | 6.0 | 59 | 0.01 plus contact resistance |
| Mo | 4.8 | 140 | $5 \times 10^{-6}$ |

Host substrate structure 49 and epitaxial structure 48 are pressed together at elevated temperature and pressure to form a durable metal bond between bonding layers 14A and 14B. In some embodiments, bonding is done on a wafer scale, before a wafer with an epitaxial structure is diced into individual devices. The temperature and pressure ranges for bonding are limited on the lower end by the strength of the resulting bond, and on the higher end by the stability of the host substrate structure and the epitaxial structure. For example, high temperatures and/or high pressures can cause decomposition of the epitaxial layers in structure 48, delamination of p-contact 12, failure of diffusion barriers, for example in p-contact 12, or outgassing of the component materials in the epitaxial layers. A suitable temperature range is, for example, about 200° C. to about 500° C. A suitable pressure range is, for example, about 100 psi to about 300 psi.

Figure 7:
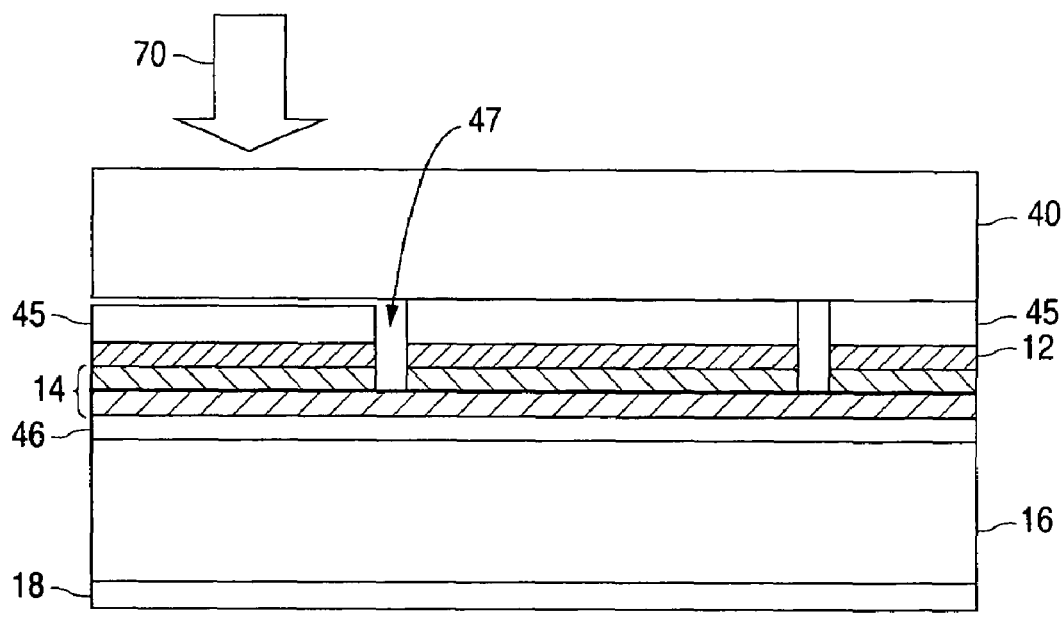
FIG. 7 illustrates a method of removing a sapphire substrate from a III-nitride epitaxial structure.

FIG. 7 illustrates a method of removing a sapphire growth substrate, stage 35 in FIG. 4. Portions of the interface between sapphire substrate 40 and the III-nitride layers 45 are exposed, through the sapphire substrate, to a high fluence pulsed ultraviolet laser 70 in a step and repeat pattern. The photon energy of the laser is above the band gap of the III-nitride layer adjacent to the sapphire (GaN in some embodiments), thus the pulse energy is effectively converted to thermal energy within the first 100 nm of epitaxial material adjacent to the sapphire. At sufficiently high fluence (i.e. greater than about 1.5 J/cm$^2$) and a photon energy above the band gap of GaN and below the absorption edge of sapphire (i.e. between about 3.44 and about 6 eV), the temperature within the first 100 nm rises on a nanosecond scale to a temperature greater than 1000° C., high enough for the GaN to dissociate into gallium and nitrogen gasses, releasing the epitaxial layers 45 from substrate 40. The resulting structure includes epitaxial layers 45 bonded to host substrate structure 49.

Exposure to the laser pulse results in large temperature gradients and mechanical shock waves traveling outward from the exposed region, resulting in thermal and mechanical stress within the epitaxial material sufficient to cause cracking of the epitaxial material and failure of wafer bond 14, which limits the yield of the substrate removal process. The damage caused by thermal and mechanical stresses may be reduced by patterning the epitaxial structure down to the sapphire substrate or down to a suitable depth of the epitaxial structure, to form trenches between individual devices on the wafer. The trenches are formed by conventional masking and dry etching techniques, before the wafer is bonded to the host substrate structure. The laser exposure region is then matched to the pattern of trenches on the wafer. The trench isolates the impact of the laser pulse to the semiconductor region being exposed.

Growth substrates other than sapphire may be removed with ordinary chemical etchants, and thus may not require the laser exposure substrate removal procedure described above. For example, a suitable growth substrate may include a thin layer of SiC grown or processed on to a thick layer of Si or SiO$_x$. The Si base layer and/or oxide layer may be easily removed by conventional silicon processing techniques. The remaining SiC layer may be thin enough to be removed entirely by known etching techniques. N-contact 10 may then be formed on the exposed surface of the epitaxial layers. Alternatively, N-contact 10 may be formed in the holes in the SiC layer.

After the growth substrate is removed, the remaining epitaxial layers may optionally be thinned to form a cavity between the photonic crystal and p-contact 12 of optimal depth and of uniform thickness, usually with thickness variations less than about 20 nm. The epitaxial layers may be thinned by, for example, chemical mechanical polishing, conventional dry etching, or photoelectrochemical etching (PEC). PEC is illustrated in FIG. 8.

As illustrated in FIG. 8, the host substrate and epitaxial layers (structure 53) are immersed in a basic solution 50. An example of a suitable basic solution is 0.1 M KOH, though many other suitable basic solutions may be used and typically depend on the composition of the material to be etched. The epitaxial surface of structure 53, often an n-type GaN layer, is exposed to light with energy greater than the band gap of the surface layer. In the example illustrated in FIG. 8, ultraviolet light with a wavelength of about 365 nm and an intensity between about 10 and about 100 mW/cm$^2$ is used. Exposure to the light generates electron-hole pairs in the surface semiconductor layer. The holes migrate to the surface of the epitaxial layers under the influence of the electric field in the n-type semiconductor. The holes then react with the GaN at the surface and basic solution 50 to break the GaN bonds, according to the equation $2GaN+6OH^-+6e^+=2Ga(OH)_3+N_2$. An external electric potential may be applied across electrodes 51 and 52 to accelerate and control the etching process.

In some embodiments, an etch stop layer is incorporated into the epitaxial layers, as described above in FIG. 4. The etch stop layer may have a band gap greater than the layer to be etched. For example, the etched layer may be GaN, and the etch stop layer may be AlGaN. The light sources used to expose structure 53 is selected to have an energy greater than the band gap of the layer to be etched, but less than the band gap of the etch stop layer. Accordingly, exposure to the light does not generate electron-hole pairs in the etch stop layer, effectively halting the etch once the etch stop layer is reached. In some embodiments, InGaN may be used as the etch stop layer. Indium oxide, formed as the InGaN decomposes, is insoluble in the etchant solution and coats the surface of the etched layer, terminating the etch.

Though the embodiment illustrated in FIG. 2 shows an n-type region with the same thickness in the photonic crystal region and in the region underlying contact 10, in some embodiments a three dimensional structure may be formed on n-type region 108 during thinning. For example, n-type region 108 may be patterned such that the portion under contact 10 is thicker than the portion forming the photonic crystal, in order to minimize the thickness of the cavity, while providing enough n-type material under contact 10 for adequate current spreading, optimal contact resistance, and mechanical strength.

Figure 9:
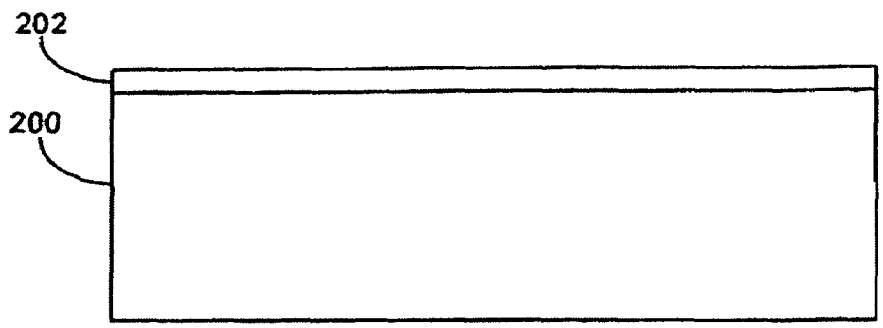
FIGS. 9-12 illustrate a method of forming a photonic crystal structure.
Figure 10:
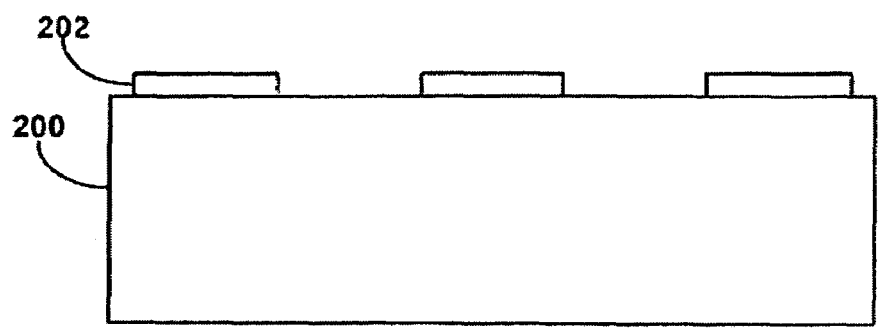
Figure 11:
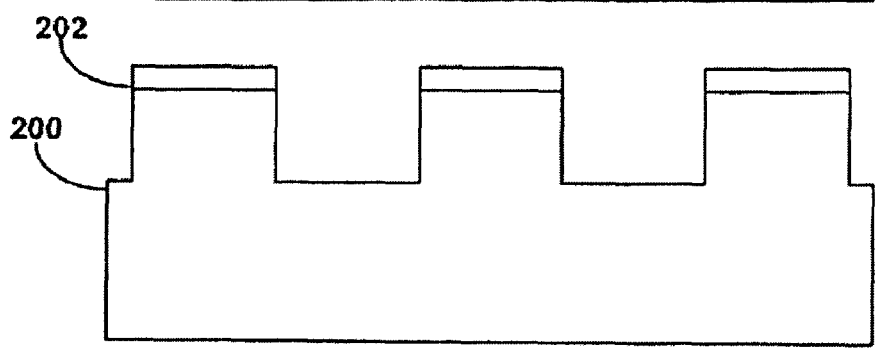
Figure 12:
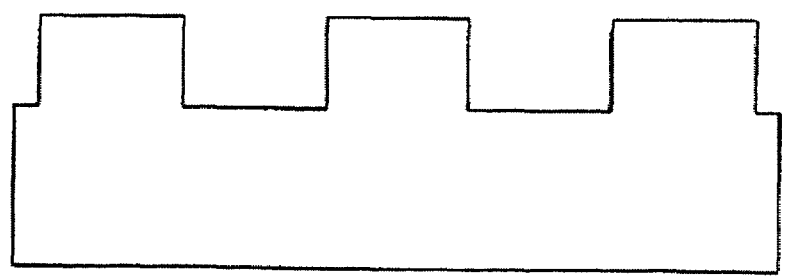

After thinning, the photonic crystal structure is formed on the exposed surface of the epitaxial layers. FIGS. 9-12 illustrate a method of fabricating the photonic crystal structure of the device of FIG. 2. One or more resist, metal, or dielectric layers 202 are formed over the top surface of the epitaxial layers, as illustrated in FIG. 9. Resist layers 202 are patterned to form a lattice of openings in FIG. 10, using a high resolution lithography technique such as electron beam lithography, nano-imprint lithography, deep X-ray lithography, interferometric lithography, hot embossing, or microcontact printing. In FIG. 11, epitaxial layers 200 are etched using known etching techniques. Damage caused by dry etching can be mitigated by a subsequent short wet chemical etch, anneal, a combination thereof, or other surface passivation techniques. The remaining resist layer 202 is then removed in FIG. 12. Other techniques for forming a photonic crystal, such as epitaxial lateral overgrowth, are described in more detail in application Ser. No. 10/059,588, "LED Efficiency Using Photonic Crystal Structure." As illustrated in FIG. 2, a portion of the surface of the exposed n-type layer may not be textured with a photonic crystal, such that n-contact 10 may be formed on a planar layer. After the photonic crystal is formed, n-contact 10 is deposited by conventional techniques.

Figure 16A:
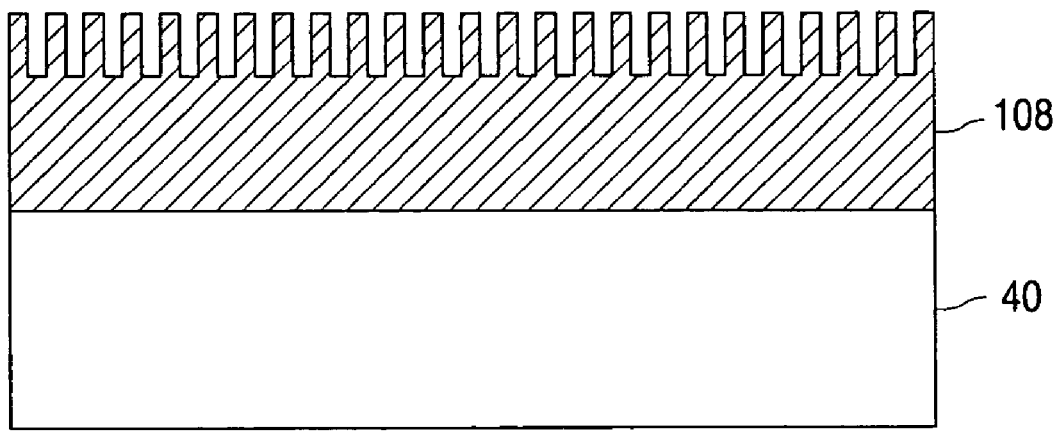
FIGS. 16A and 16B illustrate a method of forming a photonic crystal structure.
Figure 16B:
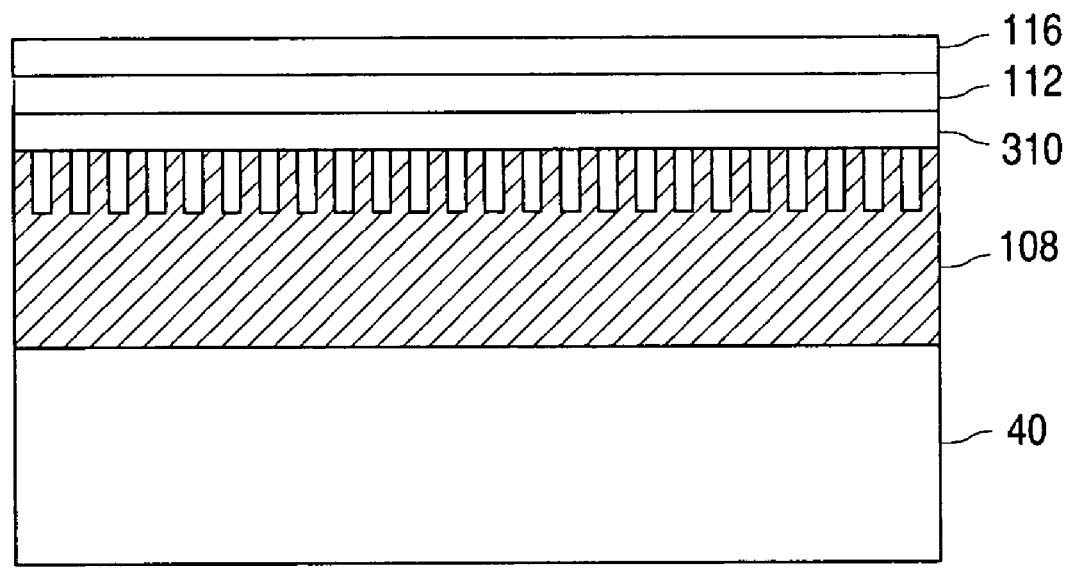

FIGS. 16A and 16B illustrate an alternative method for forming the photonic crystal. Rather than etching the photonic crystal after removing the growth substrate, a buried photonic crystal is formed during epitaxial growth. In FIG. 16A, epitaxial growth is stopped before the active layers are grown. A photonic crystal is then formed in n-type region 108, for example, by etching as illustrated above in FIGS. 9-12. The material is then placed back into the growth reactor and first a smoothing n-type layer 310, often GaN, is grown. The depth of the photonic crystal holes is greater than the diameter of the holes. The growth parameters of smoothing layer 310 are chosen so lateral growth is faster than vertical growth, ensuring that the photonic crystal holes are not filled. Once the smoothing layer 310 is closed over the photonic crystal holes in n-type region 108, active region 112 and p-type region 116 are grown. A contact may then be formed on p-type region 116, and the growth substrate removed as described above.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a III-nitride semiconductor structure including an active region disposed between an n-type region and a p-type region, the semiconductor structure having a top side and a bottom side;
   a photonic crystal structure disposed on a top side of the semiconductor structure;
   a first contact electrically connected to the n-type region and a second contact electrically connected to the p-type region, wherein the first and second contacts are disposed on a bottom side of the semiconductor structure; and
   at least one opening formed in the p-type region and the light emitting region, wherein the opening exposes a portion of the n-type region and wherein a connection between the n-type region and the first contact is disposed within the opening;
   wherein the first contact has a top surface in contact with the n-type region and a bottom surface opposite the top surface, wherein the bottom surface has a lateral extent larger than a lateral extent of the via.

2. The device of claim 1 wherein the photonic crystal structure is formed in at least a portion of the n-type region.

3. The device of claim 1 wherein a majority of light emitted by the active region that exits the semiconductor structure exits through the top side of the semiconductor structure.

4. The device of claim 1 wherein an area of the second contact in contact with the p-type region is larger than an area of the first contact in contact with the n-type region.

5. The device of claim 1 wherein one of the first and second contacts is reflective.

6. The device of claim 1 wherein the second contact is reflective.

7. The device of claim 1 wherein the second contact comprises Ag.

8. The device of claim 1 wherein the p-type region and the active region are removed from a first portion of the device, and the first contact is formed on the first portion.

9. The device of claim 1 wherein the first contact and the photonic crystal structure are formed on opposite surfaces of the n-type region.

10. The device of claim 1 further comprising a host substrate connected to the semiconductor structure.

11. The device of claim 10 wherein the first and second contacts are connected to the host substrate.

12. The device of claim 11 wherein a shape of a connection between the first contact and the host substrate differs from a shape of a connection between the first contact and the n-type region.

13. The device of claim 1 further comprising a material disposed between the first and second contacts.

14. The device of claim 13 wherein the material is a dielectric.

15. The device of claim 1 wherein the photonic crystal structure comprises a periodic variation in a thickness of the n-type region.

16. The device of claim 15 wherein the periodic variation in thickness is at least $0.05\lambda$, where $\lambda$ is a wavelength in the III-nitride semiconductor structure of light emitted by the active region.

17. The device of claim 15 wherein a ratio of the period of the periodic variation in thickness of the n-type region and the wavelength of light emitted by the active region in air is about 0.1 to about 5.

18. The device of claim 1 wherein the photonic crystal structure comprises a planar lattice of holes.

19. The device of claim 18 wherein the planar lattice includes one or more lattice types selected from the group consisting of a triangular lattice, a square lattice, a hexagonal lattice, and a honeycomb lattice.

20. The device of claim 18 wherein a lattice type, lattice constant, hole diameter, and hole depth of the planar lattice of holes are selected to create a predetermined radiation pattern.

21. The device of claim 20 wherein greater than 50% of radiation exiting the semiconductor structure is emitted in an exit cone defined by an angle of 45 degrees to an axis normal to a surface of the semiconductor structure.

22. The device of claim 1 wherein a distance between a center of the active region and the photonic crystal structure is less than about $4\lambda$, where $\lambda$ is a wavelength in the III-nitride semiconductor structure of light emitted by the active region.

23. The device of claim 1 wherein a total thickness of all III-nitride semiconductor layers in the device is less than about 1 µm.

24. The device of claim 1 wherein a total thickness of all III-nitride semiconductor layers in the device is less than about 0.5 µm.

* * * * *